(12) United States Patent
Hardy et al.

(10) Patent No.: US 6,629,303 B2
(45) Date of Patent: Sep. 30, 2003

(54) SEMICONDUCTOR DEVICE LAYOUT

(75) Inventors: David F. D. Hardy, Stockport (GB); Steven T. Peake, Warrington (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/015,711

(22) Filed: Nov. 30, 2001

(65) Prior Publication Data

US 2002/0110959 A1 Aug. 15, 2002

(30) Foreign Application Priority Data

Dec. 15, 2000 (GB) ............................................. 0030595

(51) Int. Cl.$^7$ ................................................ G06F 9/45
(52) U.S. Cl. .................................................. 716/8; 716/2
(58) Field of Search .................... 716/2, 8, 10

(56) References Cited

U.S. PATENT DOCUMENTS

| | | | |
|---|---|---|---|
| 4,281,448 A | 8/1981 | Barry et al. | 29/577 |
| 4,542,397 A | 9/1985 | Biegelsen et al. | 357/32 |
| 4,982,245 A | 1/1991 | Hanaoka et al. | 357/15 |
| 5,340,772 A | 8/1994 | Rosotker | 437/226 |
| 6,170,080 B1 * | 1/2001 | Ginetti et al. | 716/18 |
| 6,229,163 B1 * | 5/2001 | Calafut | 257/242 |

FOREIGN PATENT DOCUMENTS

JP 59220947 12/1984 ........... H01L/21/78

OTHER PUBLICATIONS

Patent Abstracts of Japan, Masaki Yoshifumi, "Manufacture of Semiconductor device," Publication No. 59220947, Dec. 12, 1984, Application No. 58097335, May 30, 1983.

* cited by examiner

Primary Examiner—John F. Niebling
Assistant Examiner—Stacy Whitmore
(74) Attorney, Agent, or Firm—Jack D. Slobod

(57) ABSTRACT

A method of manufacturing a semiconductor device having an n by m array of cells (32) is described, where n and m are positive integers with n at least two. Individual cells (32) have perimeter regions (34) surrounding the cells, the perimeter regions between adjacent cells being common to the adjacent cells. The method includes the steps of determining the required width or widths of the perimeter regions and calculating the optimal aspect ratio of each cell to substantially minimize the total area of an n by m array of cells subject to the determined width or widths of the perimeter regions. Then, a semiconductor device having an n by m array of active having an aspect ratio substantially in accordance with the calculated ratio is made. The invention has application to a number of types of structure, including a double diode structure.

13 Claims, 4 Drawing Sheets

SEMICONDUCTOR DEVICE LAYOUT

The invention relates to semiconductor device layouts and in particular to methods of laying out and manufacturing a semiconductor device having an arrangement of cells each surrounded by perimeter regions.

The cost of silicon wafers is high as is the cost of processing such semiconductor wafers to produce the final devices. The term "real estate" is used to describe the area of a semiconductor wafer, a term which accurately reflects the high cost of each small area. Accordingly, any technique that can increase the utilization of the wafer by increasing the number of devices on a single semiconductor wafer is extremely useful. There is an ongoing need to provide the maximum number of dies on a wafer.

One prior art approach is that described in U.S. Pat. No. 5,340,772 which suggests using unusual die shapes such as trapezoids and triangles, or even highly elongated rectangles. These are said to be able to be laid out more "efficiently" on a silicon wafer. However, the approach provides a large perimeter area as a fraction of wafer area. In some cases, such as those proposed in U.S. Pat. No. 5,340,772, an enlarged perimeter area may well be beneficial. For example, an enlarged perimeter may be useful where many inputs or outputs are required. However, the approach is by no means of universal application since the large perimeter can represent a waste of space in applications with a small number of inputs and outputs. Moreover, U.S. Pat. No. 5,340,772 does not teach a method of reducing the area of each individual die.

The structure of a double diode having two epitaxial diodes separated by a trough is illustrated in FIG. 1. A first diode 26 and a second diode 28 are electrically isolated and silicon dioxide 20 is deposited at the edge of the first 26 and second 28 diodes. A glass passivation layer 22 surrounds and fills the gap between the diodes. Such diodes are fabricated on a wafer having an array of diodes, which are split from one another by scribing. To permit this, a scribe region 24 is provided around the perimeter of the double diode structure.

Such a double diode has no requirement for a large number of bonding pads around its periphery. Accordingly, it would be wasteful to increase the size of the periphery. Nevertheless, there remains a need for this semiconductor device structure to be manufactured in such a way as to increase the number of double diodes per wafer. Similar considerations apply to other multiple-element semiconductor device structures.

According to the invention, there is provided a method of manufacturing a semiconductor device having an arrangement of cells and perimeter regions surrounding the cells, the perimeter regions between adjacent cells being common to the adjacent cells, the method including the steps of: determining the required width or widths of the perimeter regions; calculating an optimal aspect ratio of each cell to substantially minimize the total area of an arrangement of cells subject to the determined width or widths of the perimeter regions; and making a semiconductor device having an arrangement of cells separated by perimeter regions with widths as determined, the cells having an aspect ratio substantially in accordance with the calculated ratio.

In this way the total area of a semiconductor device according to the invention may be minimised. It is thus generally possible to fit a greater number of semiconductor devices on a single wafer of given size.

The aspect ratio may be within 20 percent, preferably 10 percent of the optimized aspect ratio. This small possible variation in aspect ratio may be needed having regard to other considerations, such as the perimeter characteristics, whilst still gaining the benefits of the invention. However, it is preferable for the chosen aspect ratio to be within 5 percent of the optimal aspect ratio to optimise the utilization of area.

The cells may be the active regions of the semiconductor device. The perimeter regions may be electrically less active regions of the device, or even electrically inactive regions, for example isolation or insulation regions. In one particular example, the cells may be diodes of a multiple-diode device. In another particular example, they may be emitter and/or base regions of a power transistor, and/or device cells of a cellular power device. Indeed, the layout principles of the present invention may be applied to a wide variety of device types, including integrated circuits.

The semiconductor device may have an n by m array of cells, where n and m are predetermined positive integers with n at least two. n may be unequal to m. The cells may be rectangular. Alternatively, any other cell shapes could also be used: in such cases the array need not be a simple n by m array but can be more complex if required to fit the cells efficiently within the device.

Preferably, n may be unequal to m and the smaller of n and m less than or equal to 10.

The semiconductor device may have n active areas or cells in an x direction and m active areas or cells in a y direction. Normally, especially for rectangular cells x and y are perpendicular. However, with other shapes of cells, the array may have basis vectors x and y that are not perpendicular. This may occur, for example, for parallelogram shaped cells.

The aspect ratio $A_r$ of width to length of the cells for orthogonal arrays may be calculated using the equation $$A_r = \frac{mw_2 + \frac{1}{2}m(n-1)w_3}{nh_2 + \frac{1}{2}n(m-1)h_3}$$

wherein $h_2$ is the predetermined width between the upper and lower cells and the edge of the die in the y direction;

$w_2$ is the predetermined width between the left and right cells and the edge of the die in the x direction;

$h_3$ is the predetermined width between adjacent cells in the y direction; and $w_3$ is the predetermined width between adjacent cells in the x direction. The derivation of this equation will be explained below.

The width of the perimeter regions may be predetermined by the shape of the device and the design rules of the process being used. The required width of the inner perimeter regions arranged between cells may be different from the required width of the outer perimeter regions around the outside of the array. In particular, a scribe region may be provided around the outer periphery of the array to allow the individual semiconductor device to be separated from its neighbors on a wafer. Thus, the width of the outer perimeter region may need to be larger than the width of the inner perimeter regions by the required width of this scribe region.

The semiconductor device may be a double diode. The diode may have active epitaxial diode regions surrounded by passivation regions including glass passivation in a trench. As well as double diodes, other multiple mesa diode devices using such glass in trough passivation may be made.

Alternatively, the device may be an integrated circuit with circuit islands separated by isolation regions, for example of opposite conductivity type that extend through an epitaxial layer to define active-area islands of the integrated circuit.

Alternatively, the device may be, for example a cellular power transistor.

The semiconductor device may be a complete device that will be separated from its neighbours to form a die. Alternatively, the semiconductor device may form part of an integrated circuit. As will be appreciated, the reduction in area obtained by the invention is useful in either case.

In another aspect, the invention relates to a semiconductor device comprising an n by m array of cells, n and m being unequal positive integers with the smaller of n and m less than or equal to 10; and a plurality of perimeter regions of predetermined width or widths surrounding the cells, the perimeter regions between adjacent cells being common to the adjacent cells; wherein the aspect ratio of the cells is within 10 percent of the aspect ratio that minimizes the total area of the array subject to the constraint of the predetermined perimeter width or widths.

The width of the exterior perimeter region around the outside of the n by m array may be different from the predetermined width of interior perimeter region arranged between cells.

The semiconductor device may have n cells in an x direction and m cells in a perpendicular y direction; and the aspect ratio $A_r$ of the active areas is substantially given by $$A_r = \frac{mw_2 + \frac{1}{2}m(n-1)w_3}{nh_2 + \frac{1}{2}n(m-1)h_3}$$

with $h_2$ the predetermined width between the upper and lower cells and the edge of the die in the y direction;

$w_2$ the predetermined width between the left and right cells and the edge of the die in the x direction;

$h_3$ the predetermined width between adjacent cells in the y direction;

and $w_3$ the predetermined width between adjacent cells in the x direction.

In another aspect, the invention relates to a double diode comprising a pair of active epitaxial diode regions arranged side by side on a substrate; and a passivation region surrounding and between the active epitaxial diode regions; wherein the active epitaxial diode regions are rectangular with a width to length ratio between 0.7 and 0.78 and are arranged on the substrate with long sides adjacent.

To illustrate these and other features in accordance with the invention, specific embodiments will now be described, purely by way of example, with reference to the accompanying drawings in which.

Figure 2:
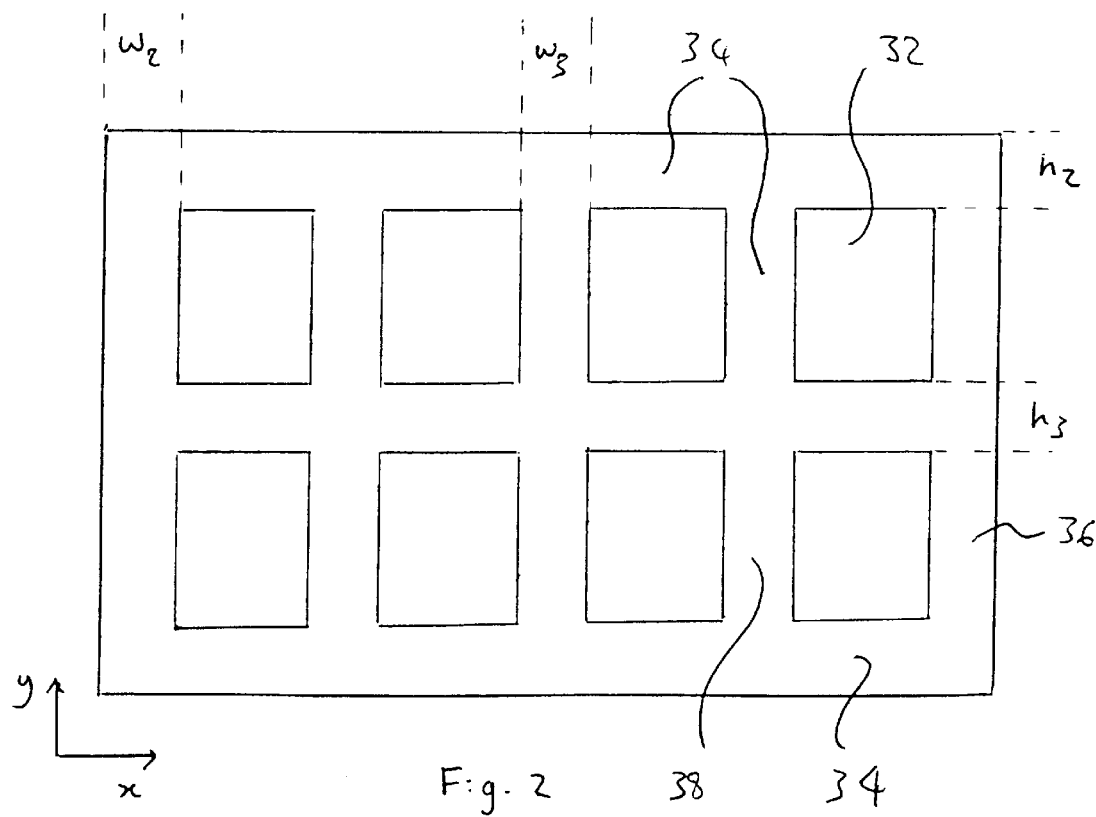
FIG. 2 shows the top view of a semiconductor device according to the invention.

Referring to FIG. 2, a semiconductor device according to the invention has a plurality of active areas 32 arranged in an array. Perimeter regions 34 surround each active area. The perimeter region 34 between adjacent active areas functions as the perimeter of each active area; it may, for example provide electrical isolation between the active areas.

The area of the active area and the size of the perimeter region will be determined by design rules required by the process or by the functional requirements of the finished product. For example, the perimeter region 34 may need to have a minimum width in order to provide sufficient electrical isolation between adjacent areas.

The outer perimeter region 36 may be subject to different constraints to the inner regions 38 between cells 32. For example, the outer perimeter may include a scribe lane which would need to be of a certain minimal width to allow separate devices on the wafer to be reliably separated without damaging the active devices.

Taking the x and y directions to be the perpendicular directions on the face of the device, the following parameters are defined:

$h_1$ is the height of the cell in the y direction;

$w_1$ is the width of the cell in the x direction;

$h_2$ is the height of the outer perimeter region, i.e. the distance between the upper and lower cells and the edge of the die in the y direction;

$w_2$ is the width of the outer perimeter region, i.e. the distance between the left and right cells and the edge of the die in the x direction;

$h_3$ is the height of the perimeter region, i.e. the distance between adjacent cells in the y direction;

$w_3$ is the width of the perimeter region, i,e, the distance between adjacent cells in the x direction;

n is the required number of cells in the x direction; and m is the required number of cells in the y direction.

Then, the area of the die $A_d$ can be calculated to be $$A_d = (2w_2 + nw_1 + (n+1)w_3)(2h_2 + mh_1 + (m+1)h_3) \qquad (1)$$

Taking $A_r$ to be the aspect ratio of a cell, $h_1$ and $w_1$ are given by $$h_1 = \sqrt{A}\sqrt{A_r} \qquad (2)$$

$$w_1 = \frac{\sqrt{A}}{\sqrt{A_r}}$$

Figure 3:
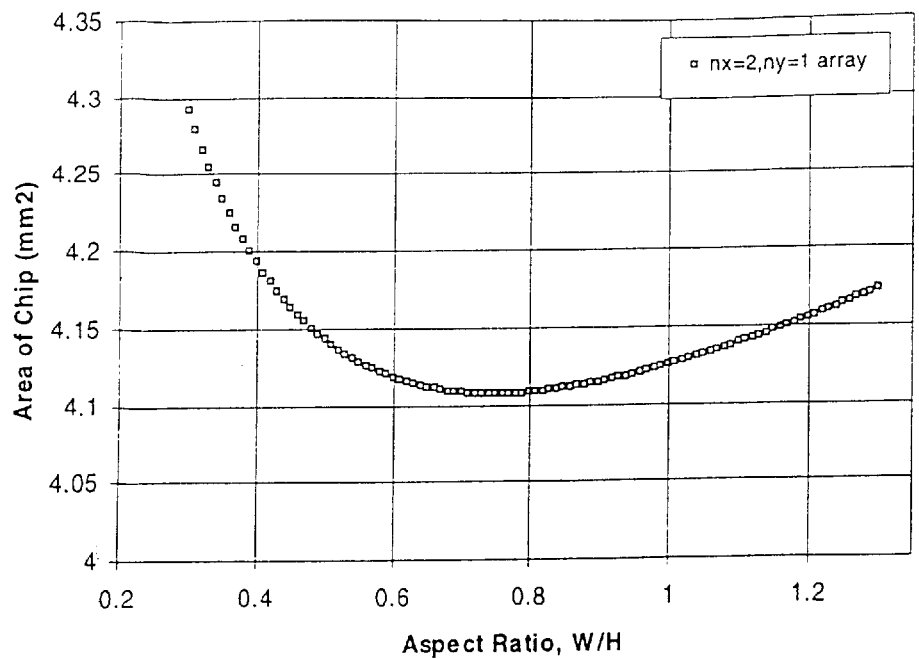
FIG. 3 shows a graph of total device area against the active ratio of a single active area.

These can be substituted in equation (1) to give an equation for $A_d$. As an example, FIG. 3 illustrates the total area of a die with n=2, m=1, A=1 mm²; $h_2$=0.25 mm; $w_2$=0.25 mm; $h_3$=0.25 mm; and $w_3$=0.25 mm. The graph has a minimum total area for fixed active area for an aspect ratio around 0.75.

To find the optimum $A_d$ in a general case the equation for $A_d$ can be differentiated with respect to $A_r$ to find the minimum total area as a function of aspect ratio. This occurs at $$A_r = \frac{mw_2 + \frac{1}{2}m(n-1)w_3}{nh_2 + \frac{1}{2}n(m-1)h_3} \qquad (3)$$

Suprisingly, the area A of each cell falls out of the above equation. This means that the optimum aspect ratio does not depend on the area of the cell, but depends most critically on the number of cells across and along the array.

In a method according to the invention, the above analysis is used. Firstly, the type of device determines the required number of cells, i.e. n and m above. Secondly, design rules giving the required widths of the perimeter region and outer perimeter region are determined; that is to say $h_2$, $w_2$, $h_3$ and $w_3$ are ascertained. Then, the aspect ratio of the cells is calculated by using equation (3) above. A device according to the invention can then be fabricated using the determined aspect ratio as the aspect ratio of the active areas of the device and the other parameters as previously determined.

The device that is made need not necessarily have exactly the calculated aspect ratio. For example, other considerations, such as emitter perimeter characteristics are also relevant, which may in some circumstances require minor variations from the optimal aspect ratio for layout efficiency.

The method can be applied to a variety of device structures. For example, the method can provide integrated circuits with circuit islands separated by diffused isolation regions of opposite conductivity types, e.g. by a p-type isolation region extending through an n-type epitaxial layer that provides the active-area islands. In this case, the width of the p-type isolation region is the perimeter width, and the aspect ratio of the n-type active-area island is determined as discussed above. Alternatively, the cells could be transistor emitter regions in active areas of the base region of a transistor. In this case, the perimeter regions could be inactive areas of the base region which surround these active areas, such as occurs in a cellular power transistor.

Figure 4:
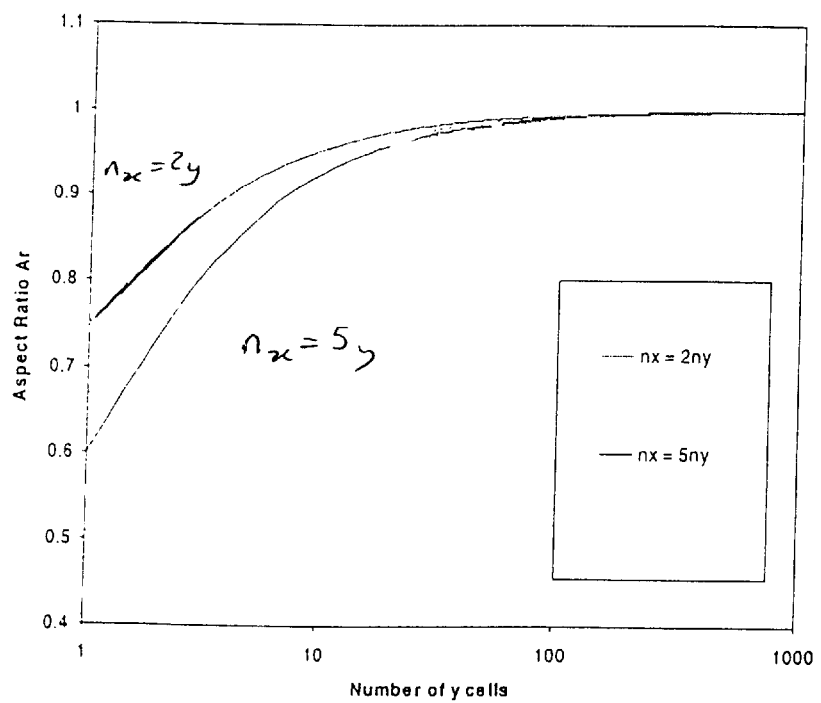
FIG. 4 shows the optimal aspect ratio as function of the number of cells in the y direction for given relationships between the number of cells in the x direction and the number of cells in the y direction.

FIG. 4 illustrates the optimum aspect ratio calculated using equation (3) as a function of m. In one curve, n is kept as 2 m as m is varied, i.e. there are twice as many cells across the width of the device as along the length. In the other, n is 4 m. As can be seen, for very large number of cells the optimum aspect ratio tends to be 1. The invention then provides particular benefit for smaller numbers of cells, for example with the smaller of n and m less than 10. In such cases the optimum aspect ratio may be markedly different from 1.

A specific example of the application of the invention will now be provided.

Figure 5:
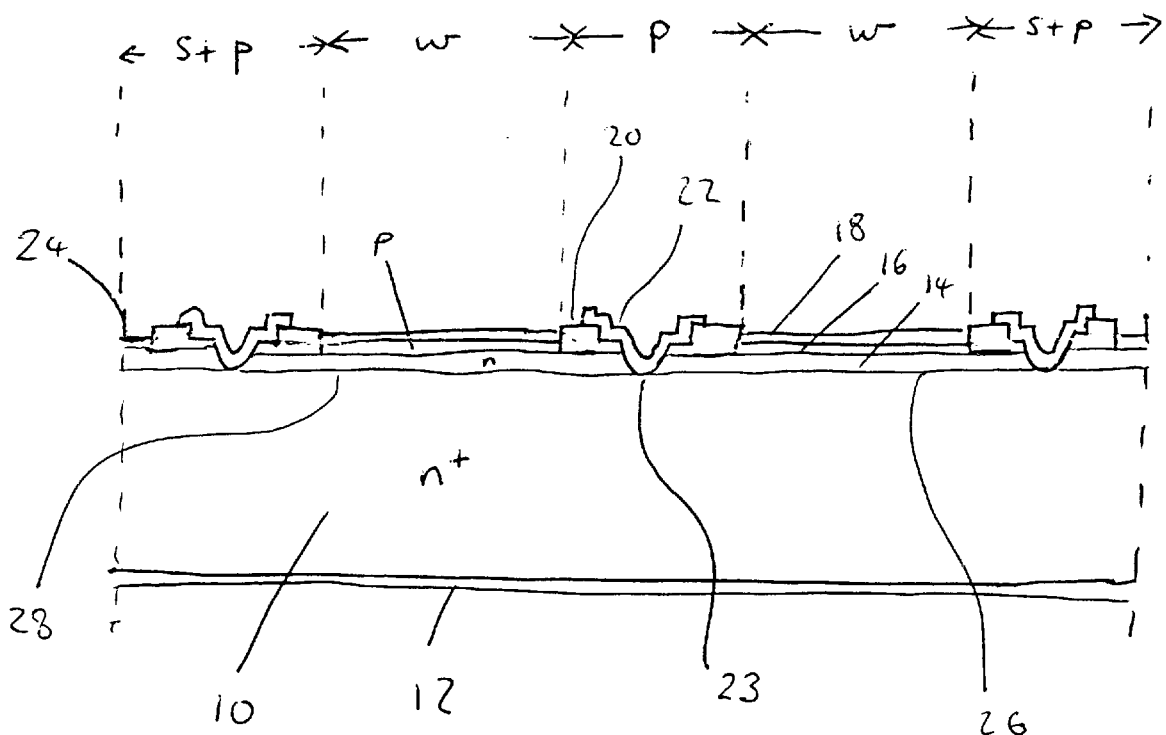
FIG. 5 shows a section through a double-diode structure according to the invention.
Figure 6:
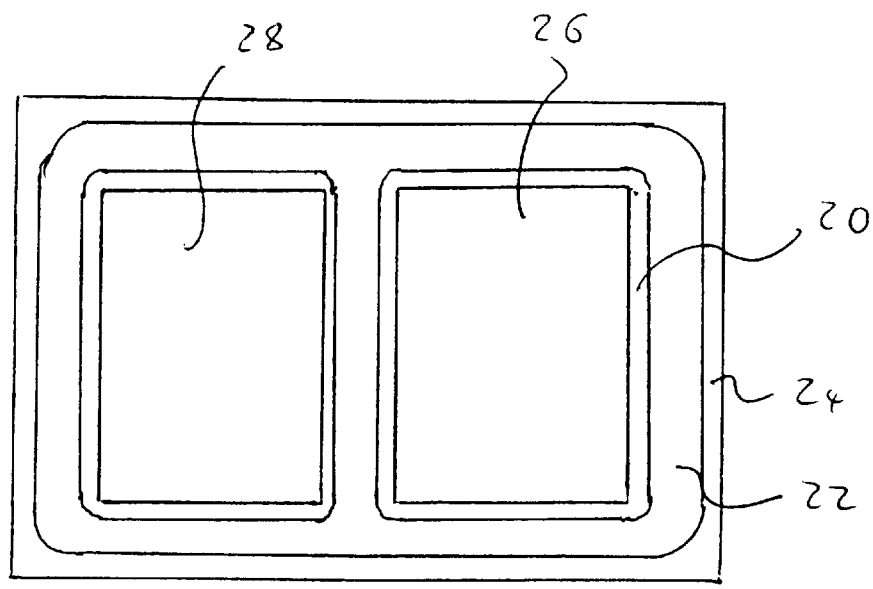
FIG. 6 shows a top view of a double-diode structure according to the invention.

Referring to FIGS. 5 and 6, a double diode structure according to the invention has an n+ body with a contact metalization 12 applied to its rear face. On the top face of the body 10 an n epi-layer 14 is covered by a p epi-layer 16 and a top metalization 18. The active devices, diodes, are constituted by the pn junction between the p type layer 16 and the n type layer 14. The areas of these pn junctions are the active areas of the epitaxial diodes.

A silicon dioxide layer 20 is arranged between and around the active areas and a groove 23 extending through the n and p epilayers runs between and around the two diodes to separate them. A glass passivation layer 22 is provided over the silicon dioxide layer 20 and in the groove 23. The grooves separate the two active devices, a first diode 26 and a second diode 28 which together constitute the double-diode structure. A scribe region 24 is provided around the outside edge of the double diode structure.

Figure 7:
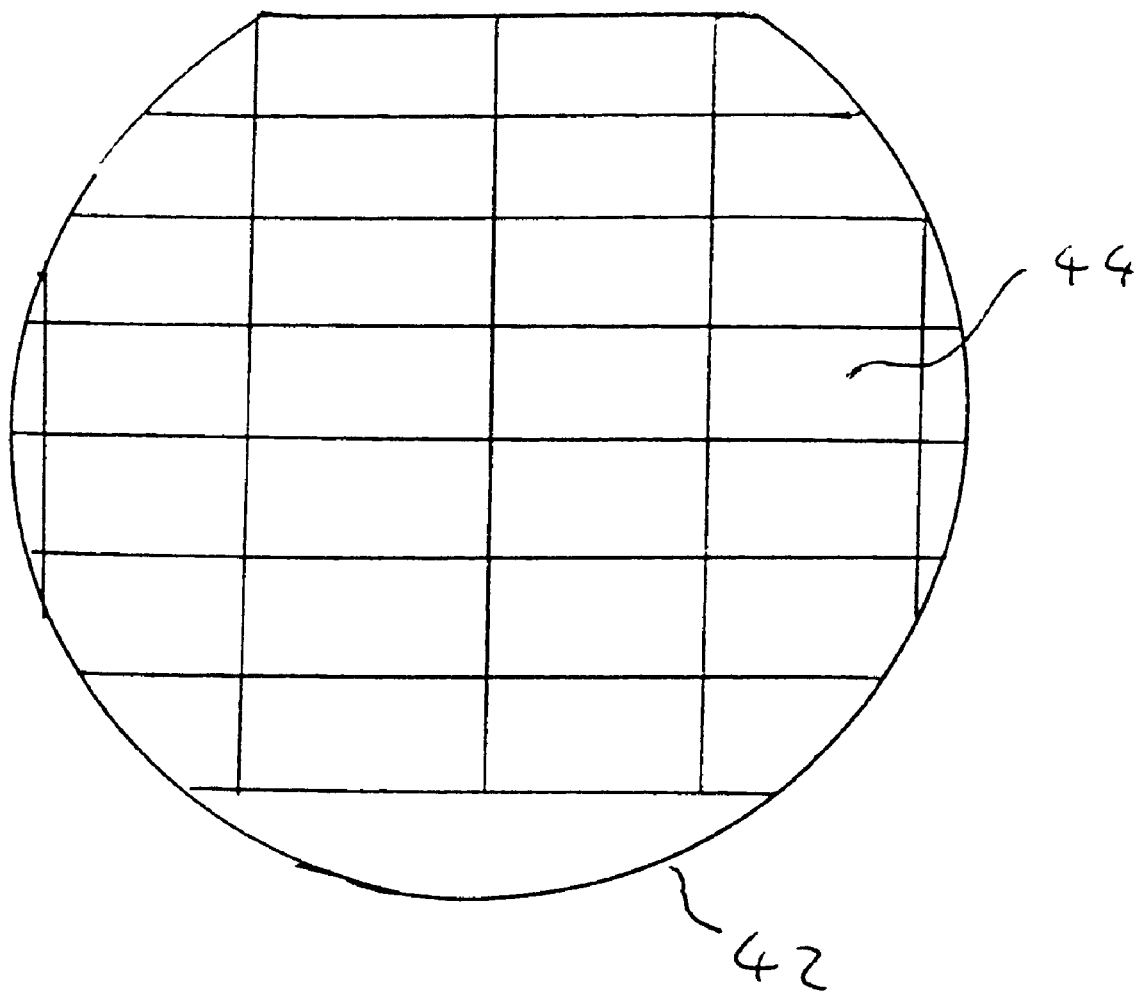
FIG. 7 shows a semiconductor wafer incorporating a plurality of semiconductor devices according to the invention.

Referring to FIG. 7, a complete wafer 42 is shown having a number of such double diode devices 44 fabricated as an array on a wafer. These are separated by scribing in the scribe lanes 24 to produce a plurality of double diodes.

Since the device is a double diode structure, n=2 and m=1. In this structure, each of the perimeter regions between and around each cell needs to have a minimum width to fit the passivation. Let this width be p. Further, a scribe lane of width s needs to be provided around the whole structure, including outside the outer perimeter passivation. Accordingly, $w_3 = h_3 = p$ and $w_2 = h_2 = (p+s)$. Substituting in (3) above, $$A_r = \frac{3}{4} - \frac{s}{4(p+s)}. \tag{4}$$

Normally, the scribe lane width s is much less than the passivation width. In this case, the preferred aspect ratio tends to a value ¾, as shown.

Figure 1:
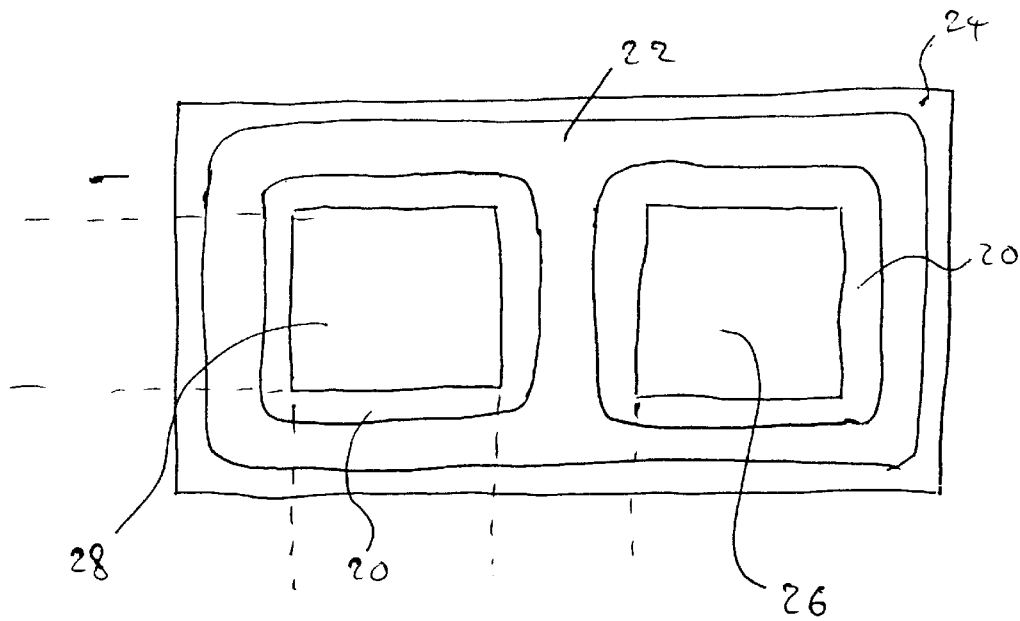
FIG. 1 shows the top view of a prior art double-diode structure.

In the specific example the minimum passivation width (p) required is 0.22 mm and the minimum scribe lane width (s) is 0.03 mm leading to a total outer perimeter width (p+s) of 0.25 mm. With these values the optimal aspect ratio is 0.72. Conventionally, the active area of diodes in a double diode structure has been square as shown in FIG. 1. Since the required area of the diode is 1 mm$^2$ the diode is arranged to have active areas 1.18 mm long by 0.85 mm wide.

The use of this aspect ratio of 0.72 gives a 2.3% reduction in the total area of the die compared with square diodes. Although this percentage figure may seem modest, the cost implications for chips manufactured in large numbers can be very significant. Note that the improvement in wafer utilization of the invention is not caused by an improved arrangement of the double diode devices on the wafer. Rather, the improvement results from a reduction in the area of each individual device.

From reading the present disclosure, other variations and modifications will be apparent to persons skilled in the art. Such variations and modifications may involve equivalent and other features which are already known in the art and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to any such features and/or combinations of such features during the prosecution of the present Application or of any further Application derived therefrom.

What is claimed is:

1. A method of manufacturing a semiconductor device having an arrangement of cells and perimeter regions surrounding the cells, the perimeter regions between adjacent cells being common to and shared by the adjacent cells, the method including the steps of:

determining the required width or widths of the perimeter regions;

calculating an optimal aspect ratio of each cell to substantially minimize the total area of an arrangement of cells subject to the required width or widths of the perimeter regions; and making a semiconductor device having an arrangement of cells separated by perimeter regions with widths as determined, the cells having an aspect ratio substantially in accordance with the calculated ratio.

2. A method according to claim 1 wherein each of the cells (32) has an aspect ratio within 10 percent of the calculated optimal aspect ratio.

3. A method according to claim 1, wherein the semiconductor device has an n by m array of cells, where n and m are predetermined positive integers with n at least two.

4. A method according to claim 3 where n is unequal to m and the smaller of n and m is less than or equal to 10.

5. A method according to claim 3 wherein the semiconductor device has n cells (32) in the x direction and m cells in the y direction and the aspect ratio $A_r$ of width to length is calculated using the equation $$A_r = \frac{mw_2 + \frac{1}{2}m(n-1)w_3}{nh_2 + \frac{1}{2}n(m-1)h_3}$$

wherein
- $h_2$ is the predetermined width between the upper and lower cells and the edge of the die in the y direction;
- $w_2$ is the predetermined width between the left and right cells and the edge of the die in the x direction;
- $h_3$ is the predetermined width between adjacent cells in the y direction; and
- $w_3$ is the predetermined width between adjacent cells in the x direction.

6. A method according to claim 3 wherein the required width of the perimeter region (36) around the n by m array is different from the required width of the perimeter regions (38) between elements of the array.

7. A method according to claim 1 wherein a scribe region (24) is provided around the outer periphery of the array.

8. A method according to claim 1 wherein the semiconductor device is a double diode having have cells of active epitaxial diode regions (26) surrounded by perimeter isolation regions (22).

9. A method according to claim 1 wherein the isolation regions include a glass passivation (22) in a trench (23).

10. A semiconductor device comprising an n by m array of cells, n and m being unequal positive integers with the smaller of n and m less than or equal to 10; and a plurality of perimeter regions of predetermined width or widths surrounding the cells, the perimeter regions between adjacent cells being common to the adjacent cells; wherein the aspect ratio of the cells is within 10 percent of the aspect ratio that minimizes the total area of the array subject to the constraint of the predetermined perimeter width or widths.

11. A semiconductor device according to claim 10 wherein the semiconductor device has n cells in an x direction and m cells in a perpendicular y direction; and
the aspect ratio $A_r$ of the active areas is substantially given by $$A_r = \frac{mw_2 + \frac{1}{2}m(n-1)w_3}{nh_2 + \frac{1}{2}n(m-1)h_3}$$

with
- $h_2$ the predetermined width between the upper and lower cells and the edge of the die in the y direction;
- $w_2$ the predetermined width between the left and right cells and the edge of the die in the x direction;
- $h_3$ the predetermined width between adjacent cells in the y direction; and
- $w_3$ the predetermined width between adjacent cells in the x direction.

12. A method of designing a semiconductor device having an array of cells and perimeter regions surrounding the cells, the perimeter regions between adjacent cells being common to and shared by the adjacent cells, the method including the steps of:
determining the required width or widths of the perimeter regions; and
calculating the optimal aspect ratio of each cell to substantially minimize the total area of an array of cells subject to the required width or widths of the perimeter regions.

13. A method according to claim 12 wherein the semiconductor device has n cells in the x direction and m cells in the y direction and the aspect ratio $A_r$ of width to length is calculated using the equation $$A_r = \frac{mw_2 + \frac{1}{2}m(n-1)w_3}{nh_2 + \frac{1}{2}n(m-1)h_3}$$

wherein
- $h_2$ is the predetermined width between the upper and lower cells and the edge of the die in the y direction;
- $w_2$ is the predetermined width between the left and right cells and the edge of the die in the x direction;
- $h_3$ is the predetermined width between adjacent cells in the y direction; and
- $w_3$ is the predetermined width between adjacent cells in the x direction.

* * * * *